United States Patent [19]

Van Wagener et al.

[11] Patent Number: 4,897,627

[45] Date of Patent: Jan. 30, 1990

[54] FLUORESCENT BALLAST ASSEMBLY INCLUDING A STRIP CIRCUIT BOARD

[75] Inventors: Raymond H. Van Wagener, Darien, Conn.; Robert A. Kulka, Livingston, N.J.; Frederick P. Bauer, Mendenhall, Miss.; Leonard J. Kurgan, Lumberton, N.C.

[73] Assignee: Magnetek Universal Mfg. Corp., Paterson, N.J.

[21] Appl. No.: 209,437

[22] Filed: Jun. 21, 1988

Related U.S. Application Data

[63] Continuation-in-part of Ser. No. 122,577, Nov. 16, 1987, Pat. No. 4,766,406, which is a continuation of Ser. No. 39,780, Apr. 16, 1987, abandoned, which is a continuation of Ser. No. 747,353, Jun. 21, 1985, abandoned.

[51] Int. Cl.$^4$ .................. H01F 15/02; H01F 15/10
[52] U.S. Cl. ........................... 336/65; 29/846; 174/DIG. 2; 174/266; 336/192; 336/208; 361/377
[58] Field of Search .................. 29/827, 831, 846, 847, 29/848, 849; 361/377; 174/DIG. 2, 68.5; 336/65, 198, 208, 192, 83, 90, 92

[56] References Cited

U.S. PATENT DOCUMENTS

| | | | |
|---|---|---|---|
| 2,433,384 | 12/1947 | McLarn | 174/68.5 |
| 3,158,926 | 12/1964 | Nieter | 29/848 |
| 3,281,744 | 10/1966 | Melanson | 336/192 X |
| 3,332,049 | 7/1967 | Hisano | 336/83 |
| 3,486,224 | 12/1969 | Chaney | 336/192 X |
| 3,496,503 | 2/1970 | Morris | 336/65 |
| 3,528,173 | 9/1970 | Gall | 174/68.5 X |
| 3,665,358 | 4/1972 | Leuck et al. | 336/192 X |
| 4,075,590 | 2/1978 | Foldes | 336/198 X |
| 4,156,222 | 5/1979 | Rossman et al. | 336/198 X |
| 4,200,853 | 4/1980 | de Jong et al. | 336/192 |
| 4,352,081 | 10/1980 | Kijima | 336/198 |
| 4,419,814 | 12/1983 | Hasserjian | 336/198 X |
| 4,495,480 | 1/1985 | Martin et al. | 336/192 X |

FOREIGN PATENT DOCUMENTS

52-76634  6/1977  Japan .................. 336/198

Primary Examiner—Thomas J. Kozma
Attorney, Agent, or Firm—Darby & Darby

[57] ABSTRACT

A fluorescent ballast assembly has a primary coil wound on a primary coil bobbin and a lag coil wound on a lag coil bobbin, each coil having wire starts, taps and finishes. A strip circuit board including a plurality of pin receiving holes and a plurality of wire insertion holes corresponding to the wire starts, tabs and finishes, is attached substantially perpendicular to and in contact with the bobbins. The strip circuit board has an insulating support with conductive strips attached thereto, preferably manufactured using automated equipment. Substituting a mechanically constructed and assembled strip circuit board for a printed circuit board eliminates the need for chemical plating or etching operations, reducing costs and easing assembly.

7 Claims, 4 Drawing Sheets

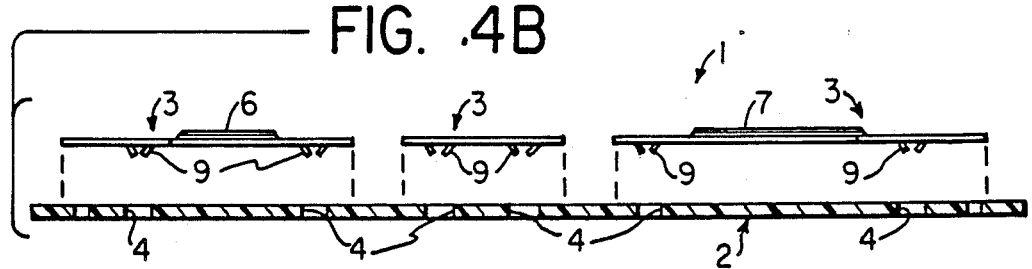
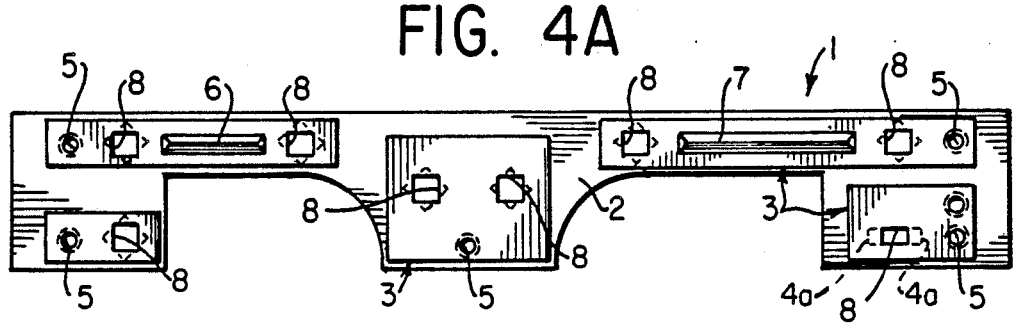
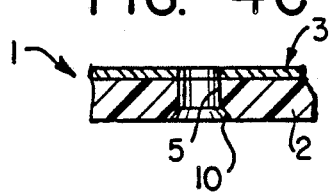

FLUORESCENT BALLAST ASSEMBLY INCLUDING A STRIP CIRCUIT BOARD

This is a continuation-in-part of application Ser. No. 122,577, filed on Nov. 16, 1987, now U.S. Pat. No. 4,766,406, which is a continuation of application Ser. No. 039,780, filed Apr. 16, 1987, now abandoned, which is a continuation of application Ser. No. 747,353, now abandoned, filed June 21, 1985.

BACKGROUND OF THE INVENTION

1. Field of the Invention

This invention relates to ballast assemblies and more specifically to a novel and improved ballast assembly including a bobbin specially suited to automated construction methods.

2. Description of the Prior Art

A fluorescent lamp customarily requires a ballast for providing the necessry starting voltage. A ballast typically includes at least one transformer coil wound on a coil bobbin and certain associated circuitry which is known. The bobbin may be provided with metallic pins for interconnecting magnet wire ends coming from the coil to a printed circuit board assembly. Thus, the complete ballast assembly may include a printed circuit board assembly, as well.

Different lamps having different power requirements and starting voltages require different ballasts. One ballast may vary from another in the particular circuit components used, the size and shape of the transformer coil, or the locations of starts, taps and finishes on similarly sized transformer coils.

Until this invention, such ballasts were manufactured and assembled using methods which are highly manual labor intensive, with resulting labor costs per unit accounting for nearly half the total production cost per unit. Bobbin and transformer coil arrangements designed for and requiring further assembly to printed circuit assemblies are shown in A. G. Weyrich, U.S. Pat. No. 3,076,165, where terminal lugs are provided to be plugged into corresponding slots in a printed circuit board; and in D. A. Peterson, U.S. Pat. No. 4,347,490, where pins are similarly provided for electrical interconnections to associated electronic circuitry on a printed circuit board. Since a ballast may included the printed circuit board as well, a standardized method of assembling not only the coil and bobbin, but also the interconnection pins, printed circuit board and associated electronic circuitry, would substantially reduce the overall cost of producing ballasts.

SUMMARY

The present invention is directed to an automated assembly method for a fluorescent ballast which provides greatly reduced labor costs, and thus greatly reduced overall manufacturing cost of such a ballast. A versatile ballast construction is provided to take advantage of standardized and automated assembly steps. The ballast may include a metal interconnection pin, ballast coil wiring, a coil bobbin, and a printed circuit board. The bobbin and printed circuit board may be arranged so as to permit different pin locations, as well as different combinations of electronic components mounted on the printed circuit board. In this way, ballasts having different power and starting voltage requirements may be constructed from the same basic coil/bobbin/printed circuit board assembly. The standardization of these elements among different ballast assemblies further results in consistent quality levels.

In a preferred embodiment of the invention, standardized bobbins have metal pins automatically inserted in one or more holes at predetermined locations in the bobbin flange edges. A magnet wire coil is automatically wound onto the bobbin, after which the coil wire leads are automatically dressed and soldered onto the metal pins. The coil may be automatically covered with a protective tape.

The coil/bobbin assembly is further assembled to a printed circuit board having pin-receiving locations corresponding to the predetermined metal pin locations, or holes, in the bobbin flange edge. Some or all of the holes may actually be provided with pins, depending upon the particular variation of ballast being manufactured from the standardized piece parts. The printed circuit board, also having standardized, predetermined circuitry and component part locations, is assembled with a predetermined set of components specially adapted for the particular variation of ballast.

In another embodiment, the coil/bobbin assembly utilizes a strip circuit board, rather than a printed circuit board. This strip circuit board includes pin receiving locations corresponding to the predetermined metal pin locations. or holes in the bobbin flange edge, as previously described relative to the printed circuit board. The strip circuit board includes an insulated backing support which may be rigid or flexible, with one or more conductive strips mounted thereon. Holes are mechanically punched through the conductive strips prior to mating with the support which includes precut holes for aligning the conductive strips at the pin receiving locations. After alignment, the partially punched metal is pushed completely through and folded over the backing support to provide a conductive path in the through holes receiving mating pins.

The strip circuit board also includes wire insertion holes for passing wires therethrough for connection with the conductive strip by soldering or other means. The holes may be provided as above described, but are more preferably provided by punching through both the assembled conductive strip and insulation support with a punch. The punched hole is then slightly counter sunk with a reamer or other tool to facilitate wire insertion. The board, being mechanically manufactured, avoids the expense of producing a printed circuit board while also eliminating an expensive plating step required for plating the through holes in a printed circuit board. Fabrication is substantially simplified, resulting in significant cost savings over a printed circuit board.

It is therefore an object of the present invention to provide an automated method of producing high quality ballast assemblies.

Another object of the invention is to provide a ballast assembly specially adapted to be manufactured by automatic assembly apparatus.

Yet another object of the invention is to provide standardized piece parts for use in various different fluorescent ballast assemblies.

Still another object of the invention is to reduce the cost of manufacture of ballast assemblies by eliminating many manual labor intensive steps, while at the same time improving quality of the finished ballast.

Yet another object of the present invention is to provide a simplified strip circuit board which is mechanically manufacturable by automated processing which does not require chemical etching or plating operations.

These and other objects and advantages of the present invention will become more apparent upon reference to the description and the annexed drawings.

BRIEF DESCRIPTION OF THE DRAWINGS

FIG. 4A is a top view of the strip circuit board of the present invention.

FIG. 4B is an exploded cross-sectional view of the strip circuit board, prior to assembly.

FIG. 4C is an enlarged view of a wire insertion hole.

DESCRIPTION OF THE PREFERRED EMBODIMENTS

Figure 1:
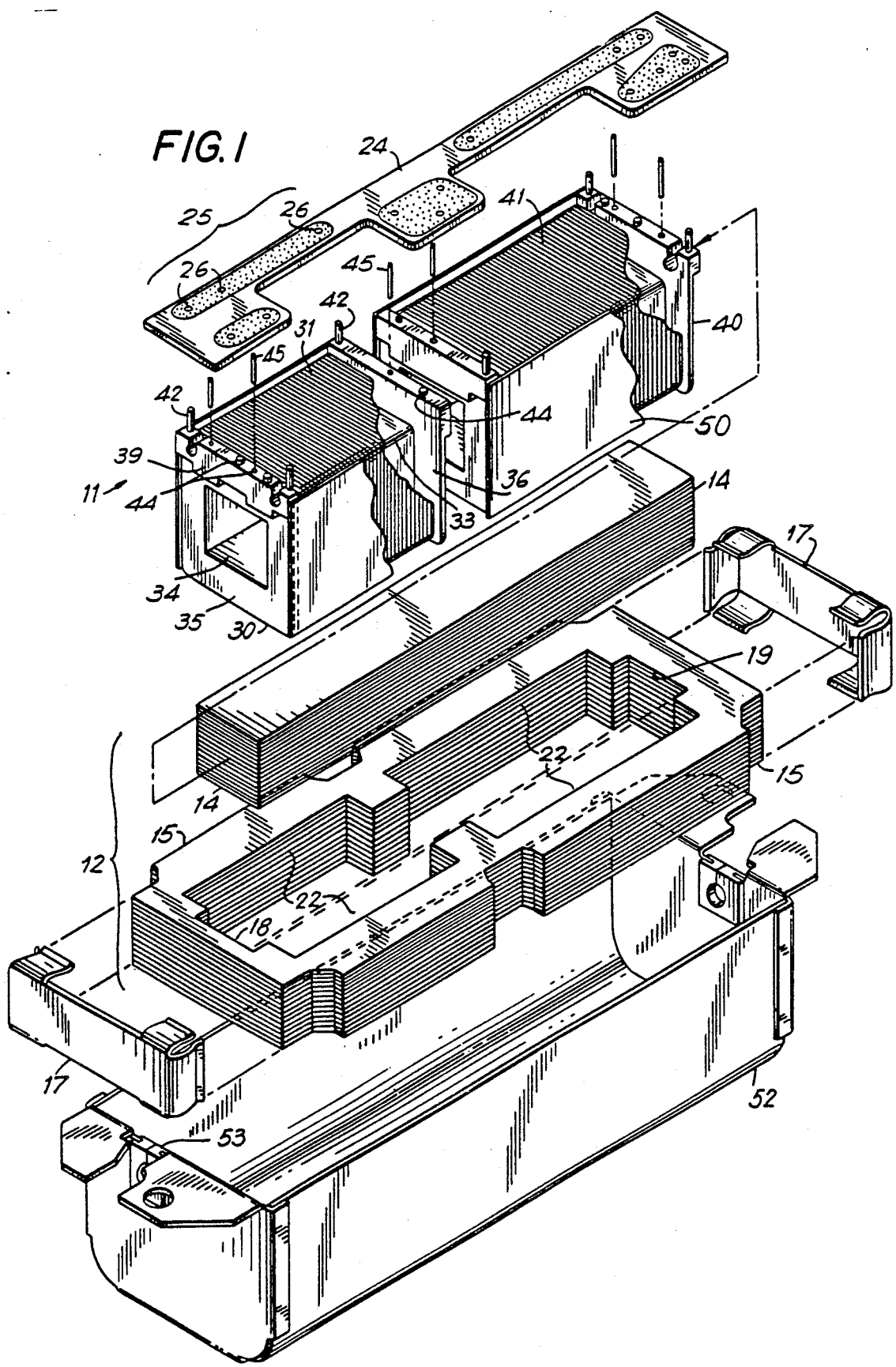
FIG. 1 is an exploded perspective view of a ballast according to the present invention.
Figure 2:
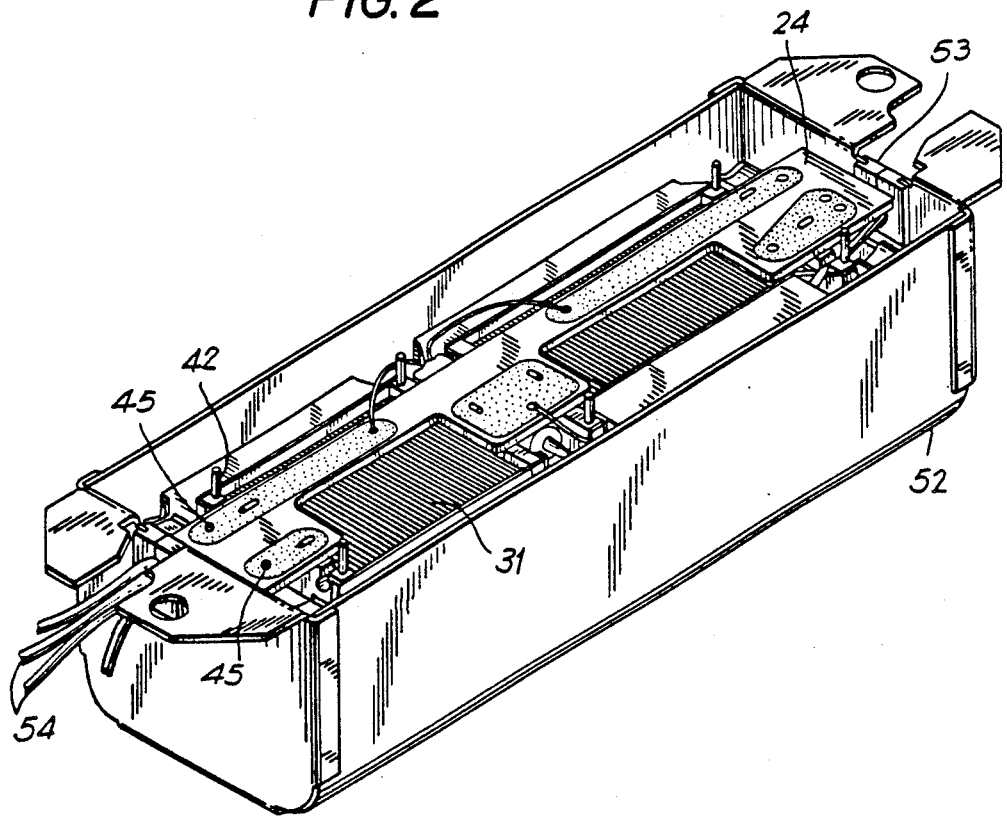
FIG. 2 is a perspective view of the fluorescent ballast of FIG. 1, after assembly.

FIG. 1 shows an exploded view of the inventive ballast, and FIG. 2 is a perspective view of the assembled device. Ballast 11 comprises a laminated core 12. The core 12 includes a center bar lamination stack 14 and a figure-eight-shaped lamination stack 15. The laminations may be held together by clips 17. The center bar 14 extends from inside one end 18 of the figure-eight-shaped opening to the other end 19 of the opening, forming four spaces or windows 22 in the two openings of the figure-eight-shaped. Bobbins 30, 40 are located around center bar 14. Coils of wire (windings) 31, 41 are wound around bobbins 30, 40, respectively, and may comprise the primary and lag windings of the ballast.

The bobbins 30, 40 may be made of any well known relatively hard plastic. Since bobbins 30, 40 have similar inventive flanges, only one bobbin 30 will be further described in detail. Bobbin 30 has a central, generally, rectangular bobbin core 33 for holding the winding 31. Through the bobbin core 33 passes a central rectangular hole 34 for receiving the center bar 14. Substantially planar flanges 35, 36 are provided at the ends of the bobbin 30 for purposes to be described.

It is customary to provide flanges 35, 36 to retain winding 31 on the bobbin core 33. The inventive flanges 35, 36 according to the present invention have built-up portions 39, 40 on at least one side of the bobbin 30. Extending outwardly from the edges of the built-up portions 39, 40, substantially parallel to one another and to the respective planes of each of the flanges, are integral posts 42, spaced at predetermined locations. The built-up portions 39, 40 further have a plurality of holes 44, which may be rectangular, for receiving connecting pins 45, which also may be rectangular in cross-section. The holes 44 extend from the edge of each flange into that flange in a direction substantially parallel to the plane of the flange. The holes 44 are spaced at predetermined locations, for reasons made clear below.

Ballast 11 further comprises a printed circuit board 24, which may have electrical components connected to it, as is customary. Printed circuit board 24 has a pattern 25 of through holes 26 corresponding to the locations of the posts 42 and holes 44 of the bobbin flanges 35, 36. The pattern 25 is formed at several locations and orientations on the circuit board 24, thus permitting circuit board 24 to be affixed to the the bobbins 30, 40 in several different positions, in accordance with aspects of the invention.

In any particular ballast according to the invention, fewer connecting pins 45 may be required than the number of holes 44 provided for these pins. Pins 45 and posts 42 provide structures onto which winding leads from coil starts, taps and finishes can be wound and attached. Different ballast variations may have starts, taps and finishes located differently, yet the connecting pins 45 and posts 42 are still located in predetermined spacing relationships.

According to the invention, the bobbin and printed circuit board thus provide an extremely flexible and versatile combination which can be used to make many different ballasts. Certain ballasts may require all available connecting pin holes 44 to be used; others may require only a few pins 45 to be automatically inserted into the bobbin flange. Also, a particular printed circuit board 24 may not occupy all of the available posts 42, thus permitting another printed circuit board to be mounted on the remaining posts.

Furthermore, certain fluorescent lamps may require two or more of each of the primary and lag coils, or one ballast assembly cluster may be used for a number of lamps. In these cases, ballast coils may be arranged end-to-end or side-by-side, with uniform printed circuit boards having predetermined repetitive uniform hole patterns overlapping from bobbin to bobbin. This modular approach provides for greater versatility than was possible before this invention.

Other features of ballast 11 include magnetic gapping (insulating) material 50, which, if used in a particular ballast, may be positioned between the windings 31, 41 and the figure eight-shaped lamination 15. The coils and core may be mounted in a housing 52, having grommets 53 through which wires 54 may pass for providing power in, power out, ground, and switch connections.

The above-described structure provides a highly versatile ballast construction which may be used to produce a number of different ballasts from the same combination of basic standardized piece parts. For example, the windings 31, 41 may have more or fewer turns; the core 12 may have more or fewer lamination layers; different arrangements of electrical components may be required; or connecting pins 45 may be located in any available holes 44. As noted above, more than one circuit board 24 may be mounted on the posts 42 of the flanges 35, 36 where additional circuitry or coil interconnection points are required. Many other variations, modifications and substitutions will be readily apparent to those skilled in the art, and are not considered by the inventors to deviate from the spirit or scope of this invention.

Figure 3:
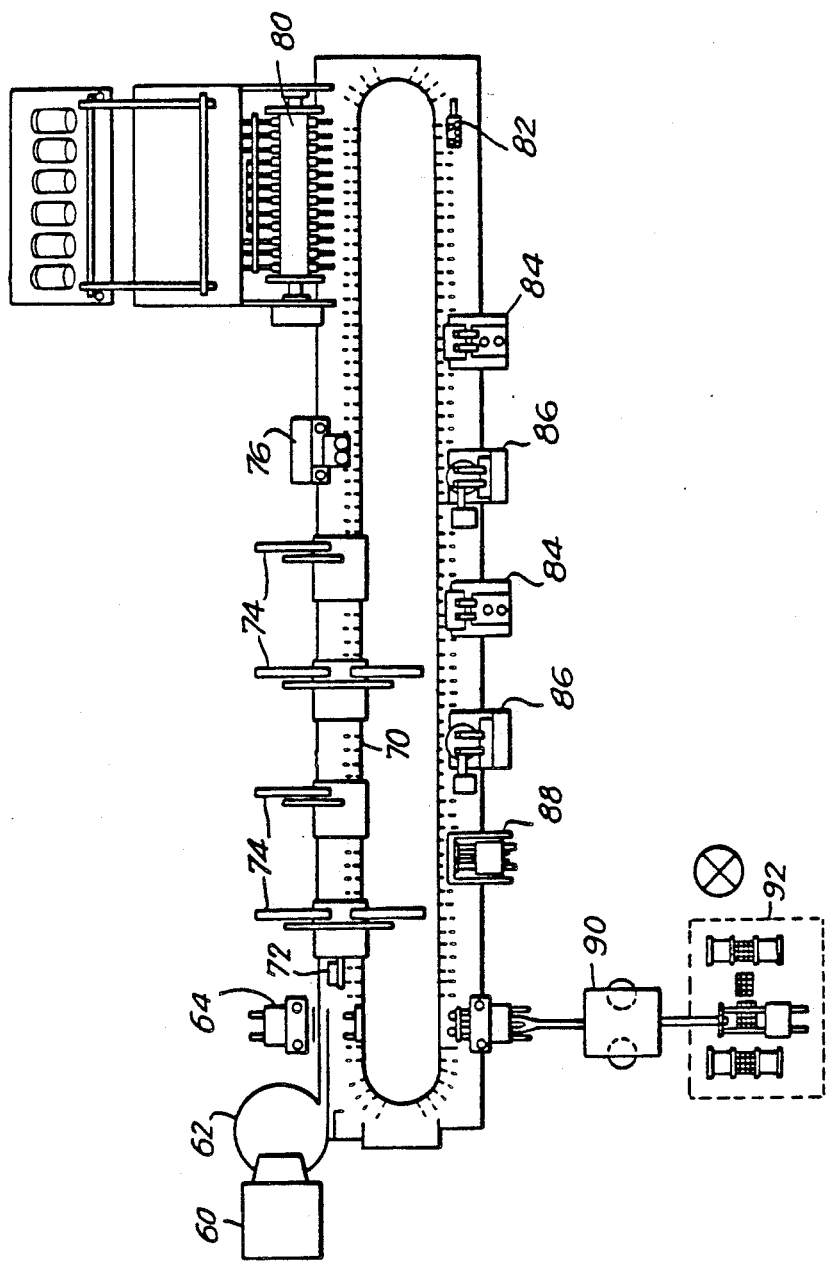
FIG. 3 is a diagrammatic representation of aspects of automated ballast assembly according to the present invention.

Referring to FIG. 3, an automated assembly process is shown which takes advantage of the structural features of the ballast according to the present invention. While each assembly stage is conventional, the collection of these stages in a continuous automatic process has not before been realized. Only with highly modular and versatile piece parts, such as those descxribed above, can an automated assembly process provide the large number of ballast variations possible.

Bobbins stored in a hopper 60 are fed by a vibratory bowl feeder 62, or similar feeding device, to a loading device 64 which automatically places individual bobbins onto a moving carousel 70. When a bobbin according to the invention is placed on the carousel 70, the precise locations of the posts and holes are accurately determinable with respect to the carousel.

Proceeding around the moving carousel, a bobbin 30 passes a detector 72 for initiating a timed sequence of events to be described. Since the travel speed of the carousel is easily determined, the precise position of a bobbin 30 at any given instant is determined. As a bobbin 30 proceeds around the carousel 70, one or more conductive connecting pins 45 may be automatically inserted or press-fit at stage 74 into one or more predetermined receiving holes 44 on the bobbin flanges. Proceeding further, the bobbin may be tested at stage 76 or probed for the presence of the proper number of connecting pins 45. As previously described, the pins and posts of the bobbin are oriented generally parallel to one another, thus permitting straight-in insertion of the printed circuit board, as will be made more clear.

A predetermined amount of wire is automatically wound onto the bobbin by, for example, a twelve spindle winder 80. Wire leads from starts, taps and finishes of the winding are automatically dressed at stage 82 onto one or more of the posts 42 and connecting pins 45. Since each of the posts 42 and connecting pins 45 necessarily protrudes beyond the edges of the bobbin 30, the leads may be affixed in place by flow soldering techniques, including dipping first in a flux composition at stage 84, and then in a molten solder bath at stage 86.

Electrical resistance of the bobbin so assembled may be tested automatically at stage 88 further along the carousel. The prepared bobbin may then be automatically taped at stage 90 with gaping material 50, if desired, and placed in a storage and transfer tray 92.

Each of the aforementioned automated steps is made possible, in part, because the locations of the connecting pins, bobbin core, flanges, etc. are precisely determined once the bobbin is placed on the carousel. The entire winding assembly process can be computer controlled, so that bobbins of different sizes, such as the primary and lag bobbins described above, can be assembled on the same carousel, as well as different pin and winding configurations of the same bobbin. The method of winding assembly eliminates previously required assembly steps known by those skilled in the art as stickwinding, paper wrapping, sawing (of the wound stick), sizing, gauging, twisting (of leads), hand soldering, and picking. This reduces the cost of manufacture of ballast assemblies by eliminating many manual labor intensive steps, while at the same time improving consistency and quality of the finished ballast.

After the automatic winding processes, the center bar 14 of the laminated core 12 may be inserted through the bobbin core 34. The remaining portions 15 of the laminated core are specially designed to be easily and rapidly pressed into position surrounding the bobbin.

With the ballast core laminations 15 in place, simplified final assembly according to the present invention may be done. The printed circuit board 24 having predetermined through holes may be inserted straight onto the pins 45 and posts 42 extending from the bobbin flanges 39. This eliminates the costly and time consuming steps of locating the coil leads or attached terminals or connecting pins to appropriate connection points on the circuit board. By simply placing the circuit board onto the posts of the bobbin flange, the connecting pins are already properly aligned with the circuit board. Electrical components may be placed on the circuit board and all connections may be completed at one time by wave soldering. Connecting pins may even be bent over against the circuit board before wave soldering, to better hold the circuit board to the bobbin/core assembly. The entire assembly may then be placed in its housing and potted, as is customary.

STRIP CIRCUIT BOARD

Referring to FIG. 4A, a strip circuit board 1 includes an insulating support 2 and conductive strips 3. It will be noted that the board 1 is identical to the printed circuit board 24 previously described in terms of overall configuration and pin location holes. It is therefore easily substituted for the printed circuit board previously described and shown in FIG. 1. The board 1 includes a plurality of pin receiving holes 4 and a plurality of wire insertion holes 5.

The insulating support 2 may be flexible or rigid, and is preferably rigid. The support may be composed of fiberboard which is easily machine cut in large quantities at a high rate. While fiberboard is preferred, the insulating support can be made of any suitable electrically acceptable material which can withstand 105° C. (U.L. Class A) and which is not hygroscopic. Typical materials include Hitex H105, VHR-115, or Kraft insulation board, which are multi-ply materials including Kraft pulp as a base. Each support is preferably provided with holes at the pin locating sites, with the holes being punched, drilled or otherwise provided. Generally, the insulating support is about 0.04–0.08 inches thick, preferably about 0.06 inches thick. Of course, the thickness should be chosen to optimize mechanical strength without detriment to the attachability of the conductive strips.

The conductive strips 3 may similarly be separably manufactured utilizing automated equipment in large quantities for later assembly with the insulating support. The strips may be composed of copper, steel, brass or other conductive metals and alloys, with brass or steel preferred. Generally, the strips are about 0.005–0.020 inches thick, depending on the mechanical strength and conductive properties of the metal chosen. In a preferred embodiment, the conductive strip is composed of brass (70/30), and is about 0.015 inches thick. In addition, the preformed strip may include strengthening structures, such as a strengthening rib, which increases the rigidity of the strip circuit board. Referring to FIG. 4A, the strips 3 include strengthening ribs 6 and 7. Another advantage of the strip circuit board is that the conductive strip can overhang the insulating support, providing a location for adding tabs, prongs, snap-ons or other electrical connection means.

The strip circuit board is assembled, preferably using automated equipment, by placing a precut conductive strip on the insulating support. It is preferable to prepunch the metal strip at the pin receiving location for ease in alignment of the strip with the precut holes in the insulating support. In one embodiment of the present invention, the strips are only partially punched through leaving an essentially pyramidical protrusion with four triangular metal sides, which may extend downwardly at an angle of from 10 to 90 degrees, with the sides being receivable by the essentially square holes in the insulating support. The conductive strip is then laid on the insulating support and the displaced triangular metal sides are then punched entirely through and folded over the fiber board backing surface, locking the strip to the support. Such a mating is illustrated by the holes 4 in FIG. 4A, with the folded sides shown in phantom.

Referring to FIG. 4B, an exploded cross-sectional view of the strip circuit board 1 is shown having an insulating support 2 including pin receiving holes 4. The conductive strips 3 include prepunched mating holes 8 having protruded triangular metal sides 9 positioned over the holes 4. The strips and support are then combined and the metal sides folded over the support to firmly attach the conductive strips to the support.

This construction provides a conductive surface in the through holes which enhances attachment of the pins to the conductive strip by allowing solder to fill the pin hole. Also, since the conductive strip is thicker than the conductive layer of a printed circuit board, welding may be used as a joining means, rather than soldering, assuring a strong bond which is less susceptible to cracking through long-term use.

In another embodiment of the present invention, the prepunched holes include two protruding sides which are then punched entirely through and folded over the fiberboard to lock the strip to the support. Referring to FIG. 4A, a pin receiving hole 4a includes two folded over sides, shown in phantom.

The strip circuit board 1 also includes wire insertion holes 5 for passing wires therethrough for connection with the conductive strips 3 by soldering or other means. The holes may be provided as above described, but are more preferably provided by punching through both the assembled conductive strip and insulation board with a punch. The punched hole is then slightly counter sunk with a reamer or other tool at the wire insertion end to facilitate wire insertion. Referring to FIG. 4C, an enlarged wire hole 5 is shown including a counter sunk wire entrance end 10. Since these holes are smaller than the pin locating holes, the metal does not extend entirely therethrough.

It will be apparent to those skilled in the art that such a mechanically constructed and assembled strip circuit board provides ease in manufacturing by an automated assembly procedure, eliminating the need for chemical plating or etching operations. Fabrication is substantially simplified, resulting in significant cost savings over a printed circuit board.

While the invention has been disclosed with reference to preferred embodiments, it will be readily understood by those skilled in the art that various changes in form and details may be made without departing from the spirit and scope of the invention.

What is claimed as the invention is:

1. A fluorescent lamp ballast comprising:
   a first bobbin, the bobbin having a central longitudinal opening extending from a substantially planar flange at one end of the bobbin to a second substantially planar flange at the other end of the bobbin;
   a second bobbin, the second bobbin also having a central longitudinal opening extending from a substantially planar flange at one end of the second bobbin to a second substantially planar flange at the other end of the second bobbin, with one flange of each of the first and second bobbins disposed adjacent the other so that the central longitudinal opening of the first and second bobbins are substantially aligned;
   a magnetic core having at least a first portion inside the aligned bobbin central openings, and second and third portions disposed on opposite sides of the bobbin;
   each bobbin flange having a plurality of holes extending inwardly from an outer flange edge on a side of the respective bobbin without said second or third magnetic core portions disposed thereon;
   a primary coil wound on one of the bobbins, and a lag coil wound on the other bobbin, the coils having starts, taps and finishes;
   conductive pins partially inserted into a number of the flange edge holes, each of the pins being electrically coupled to one of the coil starts, taps and finishes; and,
   a planar elongated strip circuit board whose length and width dimensions are approximately the same as that of the first and second bobbins positioned end to end, the circuit board having a predetermined pattern of holes therethrough, the holes being electrically coupled in a predetermined pattern by conductive metal strips on a first side of an insulating support, each hole having an end of the conductive metal strips disposed therein and on a second side of said insulating support to provide the only mechanical attachment of said strips to said support, for providing continuous conductive contact through the hole, the strip circuit board being substantially perpendicular to and in contact with each of the conductive pin bearing flange edges, each of the conductive pins extending through one of the holes through the strip circuit board and also being electrically coupled to the strip circuit board conductive strip in and adjacent to the hole through which each respective conductive pin passes.

2. The ballast of claim 1 wherein the pin bearing flange edges further comprise integral posts extending outwardly from the flange edges for positioning the strip circuit board, the strip circuit board further having positioning holes therethrough for receiving the integral flange posts.

3. The ballast of claim 1 wherein the strip includes a plurality of partially punched holes, providing a metal protrusion, each metal protrusion aligned with a hole in the insulating strip, each protrusion being bent about the back of the insulating support for firmly attaching a conductive strip to the insulating support.

4. The ballast of claim 3 wherein the conductive strip includes a preformed rib for increased rigidity.

5. The ballast of claim 3 wherein the conductive metal strip is made from a material selected from the group consisting essentially of brass, steel, copper, zinc and alloys thereof.

6. The ballast of claim 5 wherein the conductive metal strip is composed of brass.

7. The ballast of claim 3 wherein the conductive metal strip has a thickness of from 0.005–0.020 inches.

* * * * *